US012135645B2

(12) United States Patent
Ware et al.

(10) Patent No.: US 12,135,645 B2
(45) Date of Patent: *Nov. 5, 2024

(54) NONVOLATILE PHYSICAL MEMORY WITH DRAM CACHE

(71) Applicant: Rambus Inc., San Jose, CA (US)

(72) Inventors: Frederick A. Ware, Los Altos Hills, CA (US); John Eric Linstadt, Palo Alto, CA (US); Christopher Haywood, Cary, NC (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/203,569

(22) Filed: May 30, 2023

(65) Prior Publication Data
US 2023/0359559 A1    Nov. 9, 2023

Related U.S. Application Data

(63) Continuation of application No. 17/702,505, filed on Mar. 23, 2022, now Pat. No. 11,714,752, which is a
(Continued)

(51) Int. Cl.
*G06F 12/0804*    (2016.01)
*G06F 12/12*    (2016.01)
*G11C 14/00*    (2006.01)

(52) U.S. Cl.
CPC .......... *G06F 12/0804* (2013.01); *G06F 12/12* (2013.01); *G06F 2212/1044* (2013.01); *G06F 2212/205* (2013.01); *G11C 14/0018* (2013.01)

(58) Field of Classification Search
CPC ............. G06F 12/0897; G06F 12/0893; G06F 12/0895; G06F 12/0804; G06F 12/12;
(Continued)

(56) References Cited

U.S. PATENT DOCUMENTS 4,520,458 A    5/1985    Hattori et al.
5,261,110 A    11/1993    Mitsuishi et al.
(Continued)

FOREIGN PATENT DOCUMENTS

CN    101727978 A    6/2010
CN    103026346 A    4/2013
(Continued)

OTHER PUBLICATIONS

Alameldeen, Alaa R., et al. "Energy-efficient cache design using variable-strength error-correcting codes." ACM SIGARCH Computer Architecture News 39.3 (2011): 461-472. (Year: 2011).*
(Continued)

*Primary Examiner* — Charles Rones
*Assistant Examiner* — Hewy H Li
(74) *Attorney, Agent, or Firm* — Silicon Edge Law Group LLP; Arthur J. Behiel

(57) ABSTRACT

A hybrid volatile/non-volatile memory module employs a relatively fast, durable, and expensive dynamic, random-access memory (DRAM) cache to store a subset of data from a larger amount of relatively slow and inexpensive nonvolatile memory (NVM). A module controller prioritizes accesses to the DRAM cache for improved speed performance and to minimize programming cycles to the NVM. Data is first written to the DRAM cache where it can be accessed (written to and read from) without the aid of the NVM. Data is only written to the NVM when that data is evicted from the DRAM cache to make room for additional data. Mapping tables relating NVM addresses to physical addresses are distributed throughout the DRAM cache using cache line bits that are not used for data.

20 Claims, 6 Drawing Sheets

Related U.S. Application Data continuation of application No. 16/652,234, filed as application No. PCT/US2018/054206 on Oct. 3, 2018, now Pat. No. 11,301,378.

(60) Provisional application No. 62/609,925, filed on Dec. 22, 2017, provisional application No. 62/571,395, filed on Oct. 12, 2017.

(58) Field of Classification Search
CPC ....... G06F 2212/1044; G06F 2212/205; G06F 2212/7201; G06F 2212/7202; G06F 2212/7203; G06F 12/0868; G06F 12/0871; G06F 12/0246; G11C 14/0018
See application file for complete search history.

(56) References Cited

U.S. PATENT DOCUMENTS

| | | | |
|---|---|---|---|
| 5,313,650 A | 5/1994 | Mitsuishi et al. | |
| 5,630,097 A | 5/1997 | Orbits et al. | |
| 5,893,152 A | 4/1999 | Fuller et al. | |
| 5,933,844 A | 8/1999 | Young | |
| 5,996,055 A | 11/1999 | Woodman | |
| 6,000,006 A | 12/1999 | Bruce et al. | |
| 6,029,224 A | 2/2000 | Asthana et al. | |
| 6,119,205 A | 9/2000 | Wicki et al. | |
| 6,442,666 B1* | 8/2002 | Stracovsky | G06F 12/0802 |
| | | | 711/206 |
| 6,467,031 B1 | 10/2002 | Fanning | |
| 6,601,131 B2 | 7/2003 | Sezaki et al. | |
| 6,772,315 B1 | 8/2004 | Perego | |
| 6,801,994 B2 | 10/2004 | Beckert et al. | |
| 6,889,304 B2 | 5/2005 | Perego et al. | |
| 7,093,071 B2 | 8/2006 | Rudelic | |
| 7,269,708 B2 | 9/2007 | Ware | |
| 7,475,292 B2 | 1/2009 | Avritzer et al. | |
| 7,757,045 B2 | 7/2010 | Shannon et al. | |
| 7,881,145 B2 | 2/2011 | Lee et al. | |
| 8,250,328 B2 | 8/2012 | Farrell et al. | |
| 8,300,477 B2 | 10/2012 | Haukness et al. | |
| 8,427,891 B2 | 4/2013 | Best | |
| 8,554,982 B2 | 10/2013 | Nishihara et al. | |
| 8,645,617 B2 | 2/2014 | Shaeffer et al. | |
| 8,694,716 B2 | 4/2014 | Bildgen et al. | |
| 8,745,315 B2 | 6/2014 | Ware et al. | |
| 8,874,827 B2 | 10/2014 | Guo et al. | |
| 8,914,568 B2 | 12/2014 | Chinnaswamy et al. | |
| 9,158,672 B1 | 10/2015 | Zheng et al. | |
| 9,165,639 B2 | 10/2015 | Ware et al. | |
| 9,378,142 B2 | 6/2016 | Ramanujan et al. | |
| 2002/0087792 A1 | 7/2002 | Arimilli et al. | |
| 2007/0260820 A1 | 11/2007 | Qureshi et al. | |
| 2008/0010408 A1 | 1/2008 | Shen et al. | |
| 2010/0077136 A1 | 3/2010 | Ware et al. | |
| 2010/0115191 A1 | 5/2010 | Hampel et al. | |
| 2010/0185816 A1* | 7/2010 | Sauber | G06F 12/0653 |
| | | | 711/E12.024 |
| 2010/0332727 A1 | 12/2010 | Kapil et al. | |
| 2011/0055458 A1 | 3/2011 | Kuehne | |
| 2011/0060875 A1 | 3/2011 | Haukness et al. | |
| 2011/0066790 A1* | 3/2011 | Mogul | G06F 12/0638 |
| | | | 711/E12.001 |
| 2011/0072302 A1 | 3/2011 | Sartore | |
| 2011/0107032 A1 | 5/2011 | Shen et al. | |
| 2012/0137055 A1 | 5/2012 | Lee et al. | |
| 2012/0151119 A1 | 6/2012 | Yoshida et al. | |
| 2012/0324147 A1 | 12/2012 | Lai | |
| 2012/0324156 A1* | 12/2012 | Muralimanohar | G06F 11/10 |
| | | | 711/E12.008 |
| 2014/0006742 A1 | 1/2014 | Tokumitsu | |
| 2014/0052900 A1* | 2/2014 | Dai | G06F 12/02 |
| | | | 711/E12.008 |
| 2014/0059275 A1* | 2/2014 | Yun | G06F 12/0246 |
| | | | 711/103 |
| 2014/0208047 A1 | 7/2014 | Vembu et al. | |
| 2015/0103479 A1 | 4/2015 | Ware et al. | |
| 2015/0106545 A1 | 4/2015 | Godard et al. | |
| 2015/0143034 A1 | 5/2015 | Chinnaswamy et al. | |
| 2016/0170670 A1 | 6/2016 | Lesartre et al. | |
| 2016/0196208 A1 | 7/2016 | Choi | |
| 2016/0202936 A1 | 7/2016 | Lesartre et al. | |
| 2016/0239685 A1 | 8/2016 | Li et al. | |
| 2017/0060752 A1* | 3/2017 | Wei | G06F 3/0619 |
| 2017/0206165 A1 | 7/2017 | Lim | |
| 2018/0107595 A1 | 4/2018 | Jung | |
| 2018/0300258 A1 | 10/2018 | Wokhlu et al. | |

FOREIGN PATENT DOCUMENTS

| | | |
|---|---|---|
| CN | 103176752 A | 6/2013 |
| CN | 106205706 A | 12/2016 |
| CN | 106205708 A | 12/2016 |
| WO | WO-2011-081846 A2 | 7/2011 |
| WO | WO-2012-087471 A2 | 6/2012 |

OTHER PUBLICATIONS

Notification of Transmittal of the International Search Report and the Written Opinion of the International Searching Authority, or the Declaration With Mail Date Dec. 4, 2018 re: Int'l Appln. No. PCT/US18/054206. 18 Pages.

Smith, Eric, "Memory Error Detection and Correction", Published Aug. 23, 1996. 2 pages. ,http://www.brouhaha.com/~eric/computers/ecc.html#:-: text=This%20is%20shy%20parity%20is,extension%20of%20the%20parity%20concept.&text=In%20fact%2C%20the%20code%20is,Double%20Error%20Detection%20(SECDED).>. (Year: 1996).

CN Office Action with Mail Date Feb. 27, 2023 re: CN Appln. No. 201880078333.2. 15 pages.

* cited by examiner

NONVOLATILE PHYSICAL MEMORY WITH DRAM CACHE

FIELD OF THE INVENTION

The disclosed embodiments relate generally to memory systems, components, and methods.

BRIEF DESCRIPTION OF THE DRAWINGS

The detailed description is illustrated by way of example, and not by way of limitation, in the figures of the accompanying drawings and in which like reference numerals refer to similar elements and in which:

FIG. 3 depicts a memory system 300 similar to system 100 of FIG. 1, with like-identified elements being the same or similar.

DETAILED DESCRIPTION

Figure 1:
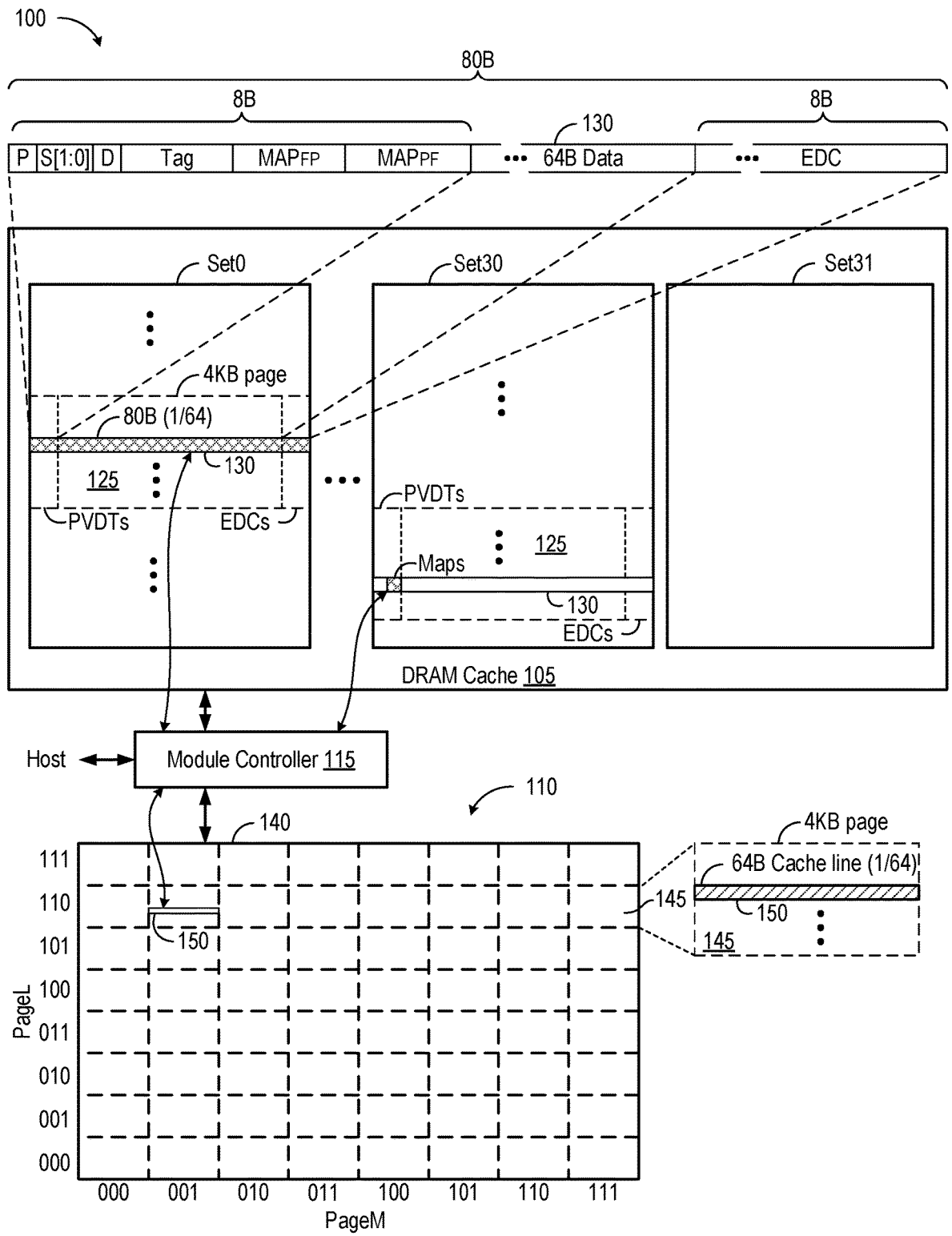
FIG. 1 depicts a hybrid volatile/non-volatile memory module 100 that employs a relatively fast, durable, and expensive dynamic random-access memory (DRAM) cache 105 to store a subset of data from a larger amount of relatively slow and inexpensive nonvolatile memory (NVM) 110.

FIG. 1 depicts a hybrid volatile/non-volatile memory module 100 that employs a relatively fast, durable, and expensive dynamic random-access memory (DRAM) cache 105 to store a subset of data from a larger amount of relatively slow and inexpensive nonvolatile memory (NVM) 110. A module controller 115 manages memory-access requests from a requesting host (e.g. a memory controller) to store and retrieve data. NVM 110 has poor endurance relative to DRAM, which is to say that NVM offers a limited number of program (write) and erase operations before becoming unreliable. Module controller 115 prioritizes accesses to DRAM cache 105 for improved speed performance and to minimize programming cycles to NVM 110. Data stored in memory module 100 is first written to DRAM cache 105 where the data can be accessed (written to and read from) without the aid of NVM 110. Data is only written to NVM 110 as needed when data is evicted from DRAM cache 105 to make room for additional data. The resultant reduction in NVM accesses increases the service life of NVM 110, and thus module 100. Module controller 115 can also execute a wear-leveling scheme that evenly distributes write operations across NVM 110 to avoid program/erase accumulations at given NVM addresses and address ranges, further increasing service life. Memory module 100 thus combines the nonvolatility, error-tolerance, and reduced per-bit price of nonvolatile memory with the speed and durability of DRAM.

Memory module 100 serves as physical memory in support of a computer operating system that, using a combination of hardware and software, maps memory addresses used by a program, called virtual addresses, into physical addresses $P_A$ of memory module 100. Virtual address space is commonly divided into 4 KB (4096b) pages, which are blocks of contiguous virtual memory addresses. The operating system maintains a page table in DRAM cache 105 or elsewhere that stores a mapping between virtual addresses VA and physical addresses $P_A$. Module controller 115 maintains mapping tables within DRAM cache 105 that associate physical addresses $P_A$ with NVM addresses $F_A$. The concept of virtual memory is well known to those of skill in the art so a detailed treatment is omitted.

DRAM cache 105 and NVM 110 are each divided into 4 KB physical pages in support of the 4 KB virtual pages of the operating system. Cache 105 is logically divided into thirty-two ($2^5$) sets Set[31:0] of 512KB ($2^{19}$) 4KB ($2^{12}$) pages 125. Each page 125 includes sixty-four ($2^6$) eighty-byte (80B) cache lines 130, each of which includes the following eight fields:

1. a 64B data field to store cached data;
2. a one-bit parity-bit field P to store a parity bit that can be used to detect bit errors in the overall cache line;
3. two state bits S[1:0] that identify whether the 64B data in the cache line represents a valid data entry and whether the cache line has a corresponding data entry in NVM 110;
4. a dirty-bit field D indicating whether the 64 B data should be written to NVM 110 before the 64B data is evicted from DRAM cache 105;
5. a five-bit cache-tag field Tag that stores physical-address bits module controller 115 employs to detect cache hits (i.e., to determine whether data associated with an access request is in DRAM cache 105);
6. a map flash-to-physical field MAPFP that module controller 115 employs to maintain a mapping between flash addresses and physical addresses;
7. a map physical-to-flash field MAPPF that module controller 115 employs to maintain a mapping between physical addresses and flash addresses; and
8. an eight-byte EDC field to store EDC bits—checksums—that can be used for error detection and correction for the cached 64B data.

NVM 110, flash memory in this embodiment, offers e.g. sixteen times the data storage of cache 105, which allows the host to specify $2^{40}$ individual data bytes (1 TB). NVM 110 is divided into 1M ($2^{20}$) erase blocks 140, only one of which is depicted here. Each erase block 140 includes an eight-by-eight array of NVM pages 145, each with 256 ($2^8$) 64B cache lines 150. Six NVM byte-address bits, which address individual bytes in the 64B cache line, are not used. NVM 110 may include one or more of single-level-cell or multi-level-cell flash memory, phase-change memory, magneto-resistive RAM, ferroelectric RAM, Nano-RAM, oxygen vacancy or conductive bridge filament resistance RAM (ReRAM), and a proprietary memory available from Intel Corporation under the trademark 3 D XPOINT.

Memory module 100 communicates 80B cache lines with the requesting host. These 80B cache lines provide an access granularity of 72B, 64B for data and 8B for error-detection and correction (EDC). DRAM pages 125 store 80B cache lines and accommodate the host's 72B access granularity. NVM pages 145 store 64B cache lines and are thus limited to data storage in this embodiment. That is, fields P, S[1:0], D, Tag, $MAP_{FP}$, and $MAP_{PF}$, and EDC are not stored in NVM 110. NVM 110 can be organized to store some or all of this information in other embodiments.

Each write request from the host is directed to a physical address $P_A$ and includes 64B of data and 8B of EDC that is a function of the data. Module controller 115, responsive to such a request:

1. maps the physical address $P_A$ to an NMV address $F_A$;
2. writes the physical address $P_A$ to a map entry $MAP_{FP}$ in one of the DRAM cache lines 130;
3. writes the NVM address $F_A$ to a map entry $MAP_{PF}$ in one of the DRAM cache lines 130; and
4. writes the page address to tag field Tag, the data to the 64B data field, and the EDC value to the EDC field of an available DRAM address.

Module controller 115 can also consider the parity bit P to detect bit errors in the incoming 80B cache line and insert default values for state variables S[1:0] and dirty bit D.

Module controller 115 allocates an erased NVM cache line 150 in NVM 110 for the physical address PA associated with the data written to DRAM cache 105 and updates map entries MAPFP and MAPPF accordingly, but does not write to NVM 110 unless and until the cached data is evicted from DRAM cache 105. The mapping fields in a given cache line 130 are not specific to the cache line; rather, the collective fields of MAPFP and MAPPF provide table entries for mapping between physical and NVM addresses. In the instant example, 64B of data from a full DRAM cache line 130 in cache set Set0 is mapped to an erased NVM cache line 150 and the mapping between the physical address PA and the NVM address FA of the erased NVM cache line is stored in a separate DRAM cache line 130 in cache set Set30.

Error detection and correction (EDC) is well understood by those of skill in the art so a detailed treatment is omitted. Briefly, DRAM can be sensitive to "soft errors" due to e.g. electrical or magnetic interference. EDC techniques allocate a fraction of DRAM storage to "checksum" information calculated by the external host and conveyed with each unit of stored data. A checksum read with each 64B cache line can then be used by the remote host to detect and correct errors. NVM is generally less sensitive to soft errors than volatile memory, and is consequently organized in a fashion that is not optimized to store the checksums used in DRAM cache 105 for EDC. EDC storage can be set aside in NVM 110, or a separate and generally less robust form of EDC can be used for data stored in NVM 110. In the latter case module controller 115 can perform EDC calculations for data conveyed between DRAM cache 105 and NVM 110.

Figure 2:
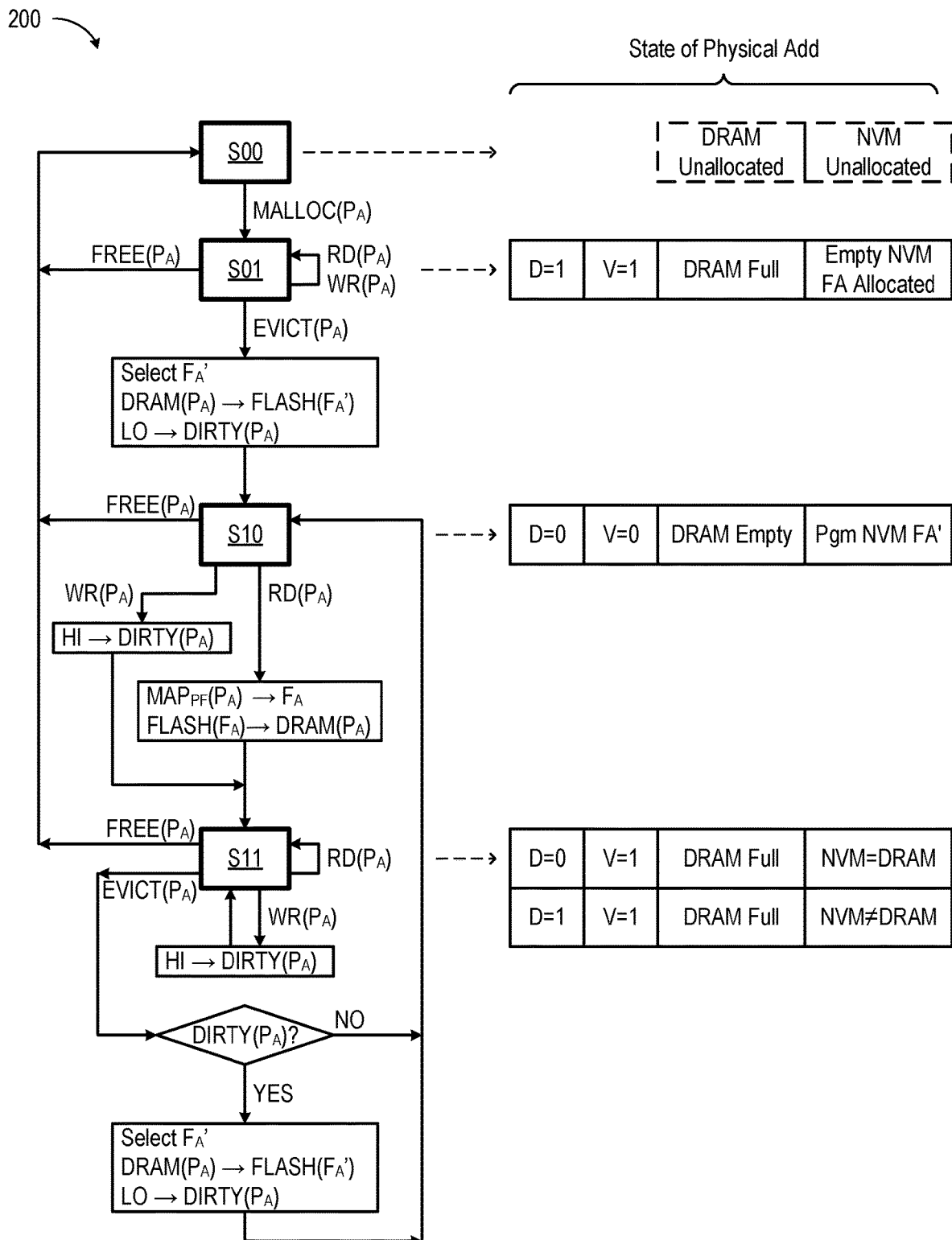
FIG. 2 is a state diagram 200 illustrating four states assigned to a given physical address PA to indicate where data associated with that physical address is stored within module 100.

FIG. 2 is a state diagram 200 illustrating four states assigned to a given physical address $P_A$ to indicate where 64B data associated with that physical address is stored within module 100. The process begins in state S00, in which case none of the cache line addresses in DRAM cache 105 or NVM 110 is allocated to the requested physical address $P_A$. To move to state S01, the physical address $P_A$ can be allocated to a process that calls a memory allocation function Malloc(PA). Alternatively, the move to state S01 may accompany the first access request directed to the physical address $P_A$. In any case, module controller 115 allocates a NVM address $F_A$ to physical address $P_A$ and updates mapping tables $MAP_{FP}$ and $MAP_{PF}$ accordingly but does not write to the allocated NVM address $F_A$. The mapping information stored in table $MAP_{FP}$ includes two bits indicative of state S01. Write data is written to an available DRAM cache line (the DRAM cache line becomes "full") and both the valid and dirty bits are set to one. State variables S[1:0] in the allocated cache line are set to S[1:0]=01.

Memory module 100 remains in state S01 for subsequent read (RD) and write (WR) accesses to physical address $P_A$. The allocated NVM cache line remains empty. A process that calls memory function Free($P_A$) can return physical address $P_A$ to state S00 so that it can be reallocated to another process. Physical address $P_A$ can also leave state S01 if the data stored in DRAM cache 105 is evicted to make room for a write to another physical address. Upon eviction, module controller 115 selects a new flash address $F_A'$, copies the contents of the evicted DRAM cache line to the new flash address $F_A'$, sets the valid and dirty bits V and D of the DRAM cache line to zero, sets state field S[1:0] to 10, and updates the mapping tables to reflect the state change and the new mapping between the physical and NVM addresses. State S10 thus retains the evicted data in NVM 110 leaving the DRAM cache line marked invalid.

Module controller 115 transitions physical address $P_A$ to state S00 if freed, or to state S11 responsive to an access request. If the access request is a write request, the dirty bit D of the newly allocated DRAM cache line is set to one. For both read and write requests, module controller 115 reads the NVM address $F_A$ from the $MAP_{PF}$ table and loads the 4K page 145 that includes the requested cache line from NVM address $F_A$ to the newly allocated DRAM page 125. In state S11 memory module 100 responds to read and write requests from the DRAM cache line until the cache line is evicted or the physical address $P_A$ is freed. If evicted, and the DRAM cache line has not been overwritten since it was copied from NVM (i.e., it is not dirty), then physical address $P_A$ returns to state S10. If a dirty cache line is evicted then module controller 115 selects a new flash address $F_A'$, copies the evicted DRAM cache line into the new flash address $F_A'$, sets the valid and dirty bits V and D of the DRAM cache line to zero, sets state field S[1:0] to 10, and updates the mapping tables to reflect the new mapping between the physical and NVM addresses and the state change to 10.

Figure 3:
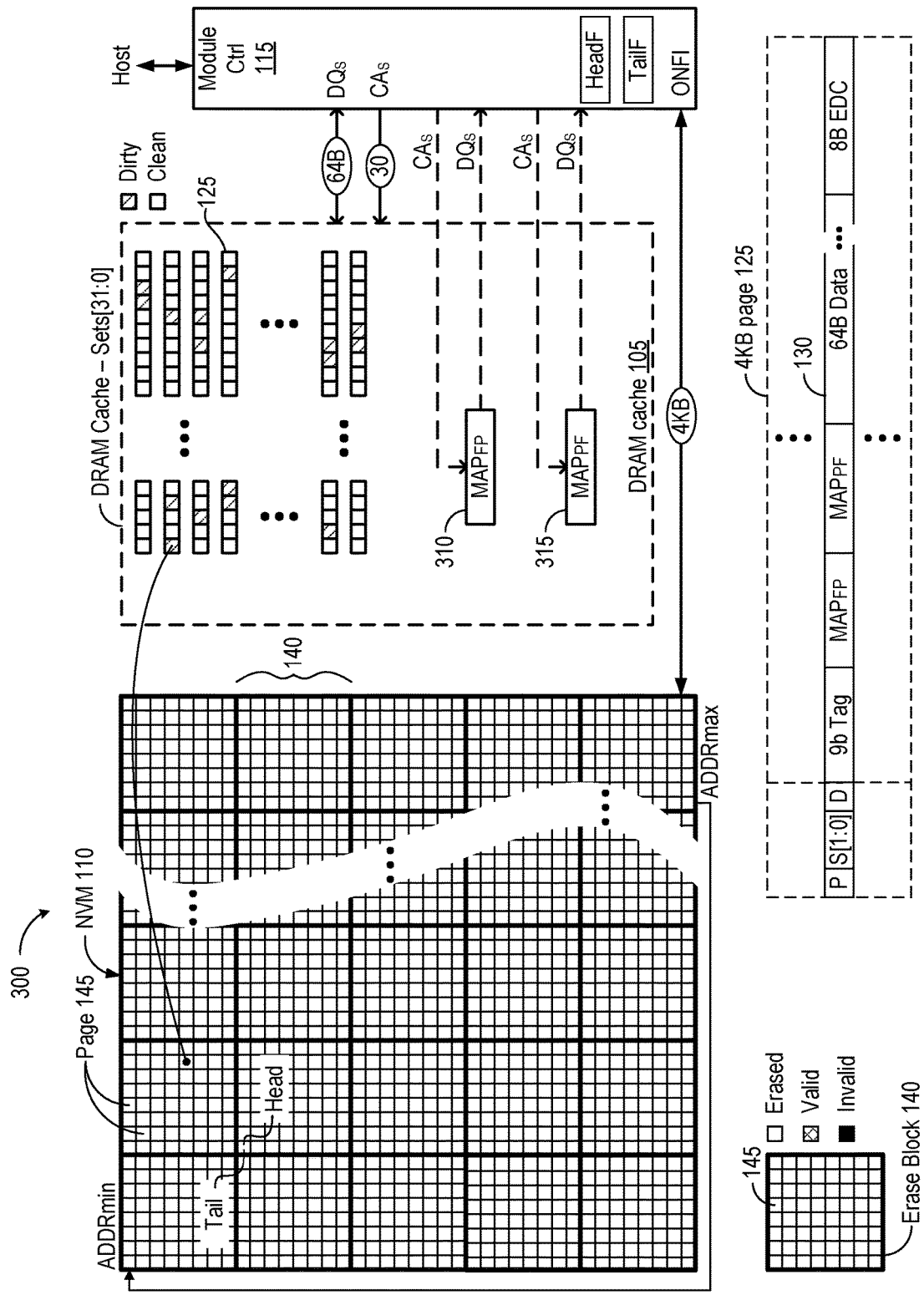

FIG. 3 depicts a memory system 300 similar to system 100 of FIG. 1, with like-identified elements being the same or similar. NVM 110 is divided up into groups of nonvolatile erase blocks (erase units) 140 and NVM pages (access units) 145. DRAM cache 105 includes thirty-two sets Set[31:0] of DRAM cache, each set divided into 4 KB pages 125 of cache lines 130. Mapping tables 310 and 315 here represent a collection of fields $MAP_{FP}$ and $MAP_{PF}$ distributed throughout cache lines 130 to maintain mappings back and forth between physical addresses and NVM addresses. Module controller 115 accesses mapping table 310 (315) by issuing commands via bus CAs conveyed to a NVM (physical) address for which a corresponding physical (NVM) address is to be read or written over data lines DQs.

Module controller 115 includes two registers that keep track of the amount of available erased pages in NVM 110: a head register HeadF contains the address of the next empty one of NVM pages 145 to receive data writes, and a tail register TailF contains the address of the one of erase units 140 storing the eldest data. The erase unit with the eldest data is likely to be among the erase units with the highest number of invalid page entries. Erasing the erase unit with the eldest data is therefore likely to free up a relatively large number of NVM pages 145 for future writes. Module controller 115 communicates with the other components of memory system 300 over a number of ports. Descriptions of some of those ports are provided below in connection with FIG. 5.

Reads and writes to NVM 110 may be performed one 4 KB page at a time, in a random-access fashion, but erasures are carried out on erase blocks 140. Each page 145 within an erased block 140 can be written to or read from. Once written to, however, a page 145 cannot be written to again until the entire erase block 140 is erased. Cache sets Set[31:0], at the direction of module controller 115, cache data and related information as noted previously, while tables 310 and 315 keep track of which physical addresses correspond to data in DRAM cache 105 and NVM 110. In one embodiment each of $2^{29}$ cache lines 130 has 6B for $MAP_{PF}$ and $MAP_{FP}$ table entries. Of these resources, about 16M are used for $MAP_{PF}$ entries and 256M for $MAP_{FP}$ entries. These distributed tables include tags to distinguish the states S00 through S11 for physical addresses mapped to NVM 110 that do not have a corresponding entry in the DRAM cache. This state information is used in a garbage-collection process, detailed below, used to reallocate invalid flash pages. Virtual-to-physical and physical-to-virtual address translation tables (not shown) may be held in secondary memory, and may be moved to memory system 300 by paging software (also not shown).

Module controller 115 tracks dirty pages 125—shaded—in DRAM cache sets Set[30:0]. Dirty pages are those that include changes not reflected in corresponding memory locations within NVM 110. NVM pages 145 can be erased or can contain information that is either valid or invalid. Module controller 115 accesses 80B cache lines in DRAM cache 105 and stores $4/5^{th}$ of this information (64B data for each cache line of each page) in a related NVM page 145 if the cache line is evicted from the DRAM cache. Limiting writes to NVM 110 to data evicted from DRAM cache 105 prolongs the service life of memory with endurance that is low relative to DRAM.

Figure 4:
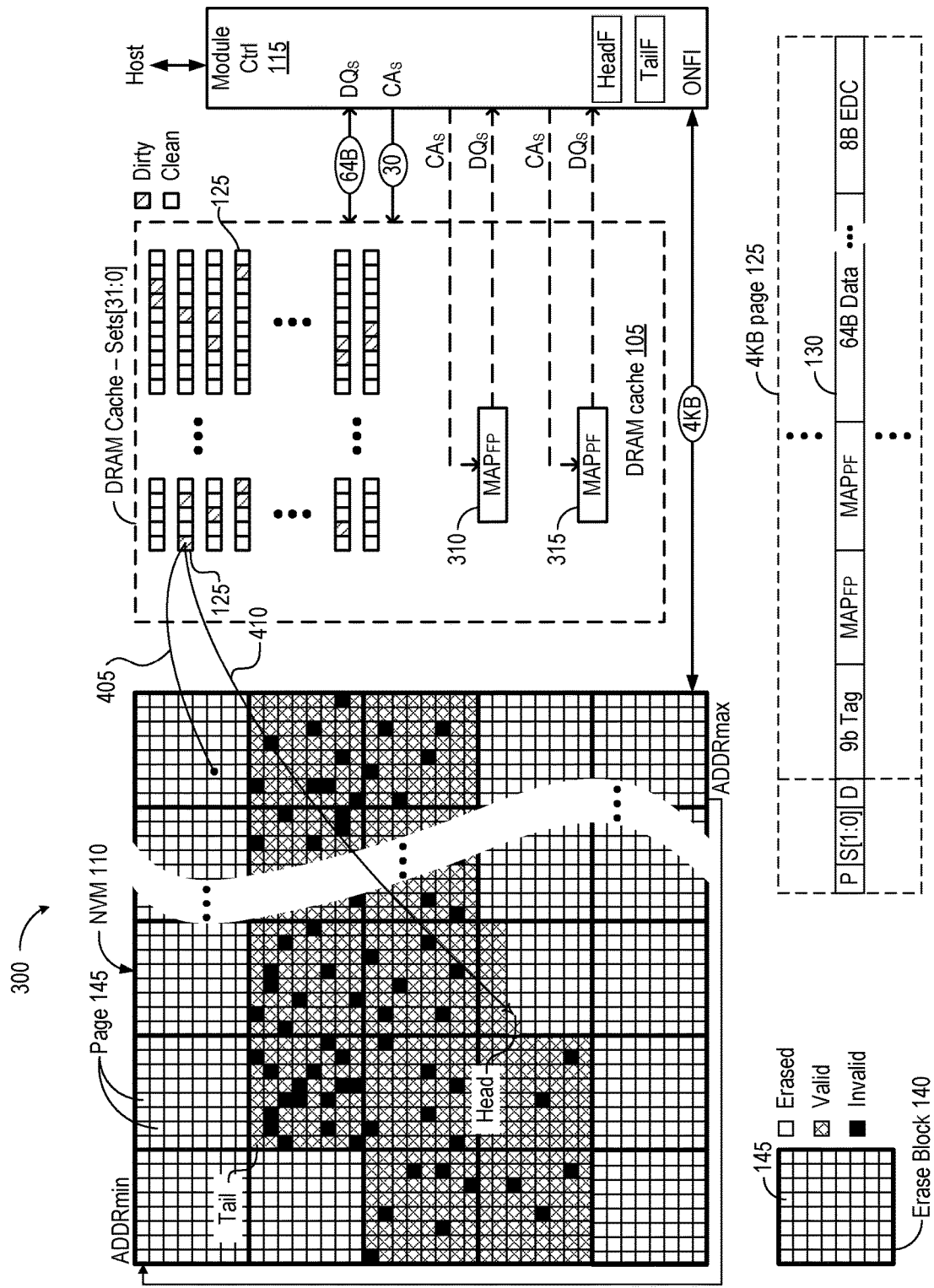
FIG. 4 depicts memory system 300 of FIG. 3 with more data stored in NVM 100.

FIG. 4 depicts memory system 300 of FIG. 3 with more data stored in NVM 100. Tail pointer Tail identifies the erase block 140 with the eldest data and head pointer Head identifies the page 145 to receive the next write from DRAM cache 105. A curve 405 extending from representative dirty page 125 illustrates how state S01 (FIG. 2) associates a full page in DRAM cache 105 with an allocated but empty page 145 of NVM 110. The host can read from and write to this page ad infinitum without accessing NVM 110 so long as the data stored in the page 125 is not evicted from the DRAM cache. If a dirty page is evicted, as illustrated by arrow 410, the evicted data is written to the page 145 of NVM 110 indicated by head pointer Head. The head pointer is then incremented to ready NVM 110 for the next evicted page.

As detailed in connection with FIG. 2, state S11 represents a physical address with data in both DRAM cache 105 and NVM 110. Such data is marked "dirty" if any cache line in the page in DRAM cache 105 has been written to since that page was loaded from NVM 110. If a dirty page is evicted then the data is stored at head pointer Head, the head pointer is incremented, the NVM page 145 with the now invalid data is marked invalid, the DRAM page is marked clean (i.e., the dirty bit is set to zero), and tables 310 and 315 are updated to reflect the new mapping between the physical address $P_A$ and the newly filled NVM page 145.

The number of NVM pages 145 marked as invalid will increase over time. A garbage-collection process is performed from time to time to recover invalid pages for subsequent use. In one embodiment module controller 115 compares the head and tail pointers of registers HeadF and TailF to sense when the number of erased NVM pages 145 drops below a threshold, in which case module controller 115 copies each valid page in the eldest erase block 140 into a page 145 at head pointer HeadF before erasing the erase block and changing the contents of register TailF to point to the next candidate erase block 140 for an erase operation.

Table 310 allows module controller 115 to quickly look up a physical address associated with a given NVM page 145 and issue a request to DRAM cache 105 to find whether that NVM page 145 contains valid data to be moved to the head pointer. In some embodiments module controller 115 maintains a table in physical memory 108 that keeps track of the number of invalid pages in each erase block 130. When the number of erased pages falls below some threshold, an erase block with many or the most invalid pages may be erased. Other wear-leveling schemes can be used in other embodiments.

Figure 5:
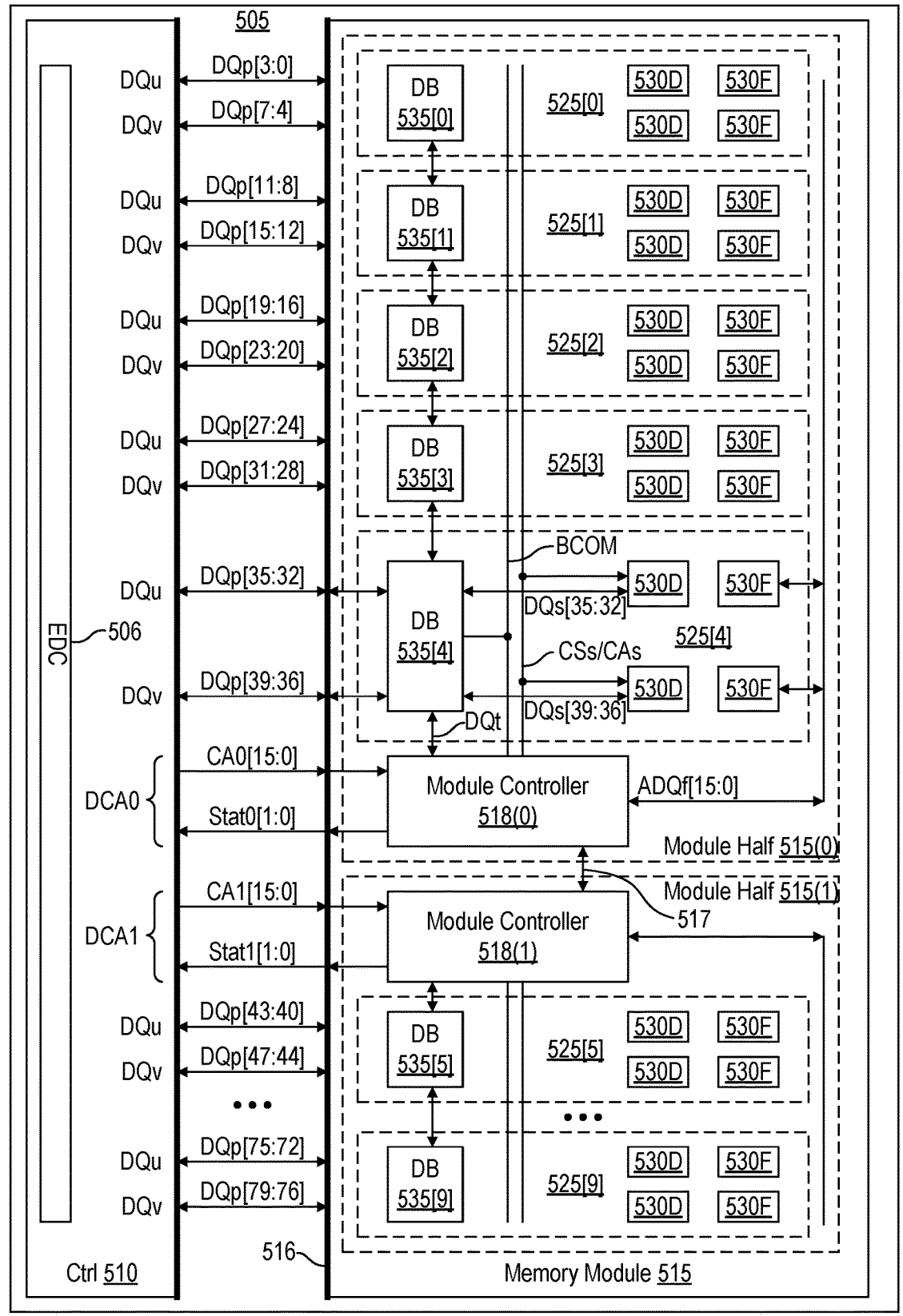
FIG. 5 depicts a hybrid memory module 500 in which DRAM components cache a subset of data stored in a larger amount of NVM.

FIG. 5 depicts a hybrid memory module 500 in which DRAM components cache a subset of data stored in a larger amount of NVM. A motherboard 505 supports a memory controller 510 that communicates with a hybrid memory module 515 via twenty pairs of nibble-wide (four-bit, or ×4) primary data ports DQu/DQv and two primary command-and-address (CA) ports DCA0 and DCA1. EDC circuitry 506 on a memory controller 510 computes EDC bits for write data and employs EDC bits associated with read data for error detection and correction. Memory module 515 is logically divided into two module halves 515(0) and 515(1) that can be controlled separately or together to communicate either forty-bit or eighty-bit data over a module connector 516. Halves 515(0) and 515(1) are identical for purposes of this disclosure; the following discussion focusses on low-order module half 515(0). Links 517 between module halves 515(0) and 515(1) allow both to respond to the same commands in the eighty-bit mode.

Module half 515(0) includes a module controller 518(0), sometimes referred to as an address buffer or a register or registering clock driver (RCD). Module controller 518(0) can be a single integrated-circuit (IC) component that manages five memory slices 525[4:0] at the direction of external controller 510.

Each slice 525[4:0] includes two NVM components 530F, two DRAM components 530D, and a data-buffer (DB) component 535. Memory components 530F are NAND flash components, but other types nonvolatile memory can be used. DRAM components 530D collectively have e.g. one one-sixteenth ($\frac{1}{16}$th) the storage capacity of flash components 530F. Among other tasks, each DB component 535 works with module controller 518(0) to manage the flow of data between DRAM components 530D of the same slice and flash components 530F from the same or different slices. The following discussion focuses on memory slice 525[4], the slice in module half 515(0) closest to module controller 518(0). The remaining slices 525[3:0] are essentially identical. DRAM and flash memories can be arranged differently in other embodiments. Where DRAM components 530D are organized in slices, for example, it could be that flash components 530F are separate from all or a subset of these slices. For example, only every other slice with one or more DRAM component might also include NVM.

Module controller 518(0) receives commands from external controller 510 via links CA0 [15:0] and returns status information via links Stat0[1:0]. Module controller 518(0) also controls: DB components 535[4:0] via a local communication bus BCOM; DRAM components 530D via a DRAM control bus CSs/CAs (for chip-select/command, and address); and flash components 530F via a flash data and control bus ADQf. In one embodiment, bus ADQf conforms to an interface specification known as ONFI, for "Open NAND Flash Interface." Other embodiments can use different interfaces and different types of volatile or nonvolatile memory.

Remaining focused on slice 525[4], DB component 535[4] communicates with controller 510 via eight primary data links DQp[39:32] and with DRAM components 530D via a corresponding eight secondary data links DQs[39:32]. Read and write memory accesses are accomplished in sixteen-bit bursts, so DB component 535[4] communicates 528 bits (4×2×16b=128b) for each memory access, and the five slices 525[4:0] of module half 515(0) communicate a cumulative 640 bits (5×128b=640b) with external controller 510. Using ten-bit bytes, module half 515(0) thus exhibits an access granularity of sixty-four bytes (64B). DRAM components 530D are collectively employed as cache memory, and the data sets transferred between DRAM components 530D and controller 510 are 80B cache lines 130 of the type introduced in FIG. 1.

Suitable caching methods and circuits are detailed in international application PCT/US2017/055908 to Ware et al. entitled "Hybrid Memory Module," which is incorporated herein by reference. Briefly, external controller 510 issues commands to access (read or write) data associated with specific physical addresses. Module controller compares cache-tag bits with physical address bits to determine whether the requested data is cached in DRAM components 530D. If so, then module controller 518(0) manages access to that cache line in a rank of ten DRAM components 530D via five DB components 535[4:0]. In this context, a "rank" refers to a set of components that module controller 518(0) accesses (read or write) responsive to a host-side memory request. Each DRAM component 530D has a data width of four bits, so module half 515(0) has a rank width of forty bits. If the accessed physical address does not have a corresponding entry in cache—a so-called cache miss—module controller 518(0) manages the requested data in the manner detailed above in connection with FIG. 2.

Flash components 530F have a higher access granularity than DRAM components 530D. When moving data from flash to DRAM, module controller 518(0) manages this disparity by reading a cache line from one flash component 530F via local bus ADQf and distributing the requested cache line evenly across all ten DRAM components 530D of module half 515(0). Data from ten DRAM components 530D are combined and conveyed to one flash component 540F to convey a cache line from DRAM to Flash.

In a wide mode, module 515 supports ranks of twenty DRAM components 530D; links 517 between address buffers 518(0) and 518(1) allow cache lines from one or more flash components 530F to be distributed across all twenty DRAM components 530D. A local bidirectional or paired unidirectional daisy-chain data bus DQt provides point-to-point connections between module controller 518(0) and each slice 525[4:0]. Caching a subset of each cache line in each DRAM component 530D supports parallel, high-speed read and write access for host controller 510. Storing complete flash cache lines in individual flash components 530F facilitates fast and efficient cache write-back and garbage-collection processes.

Figure 6:
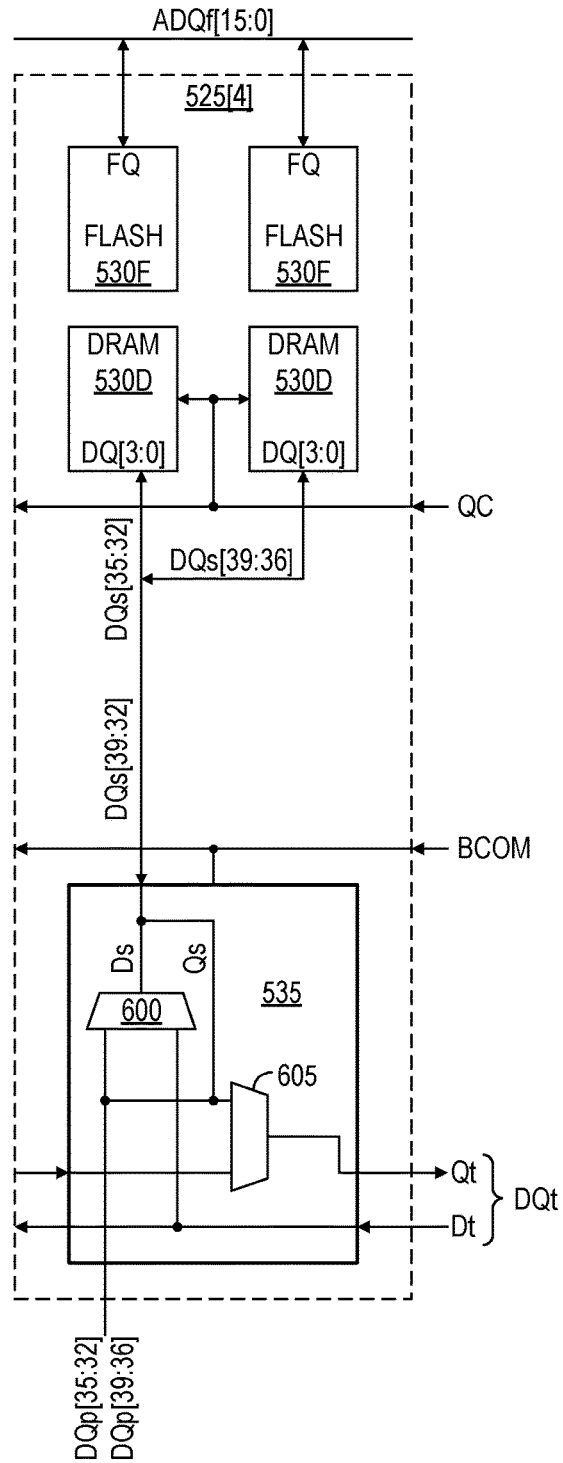
FIG. 6 depicts memory slice 525[4] of FIG. 5 in accordance with one embodiment.
Figure 6:
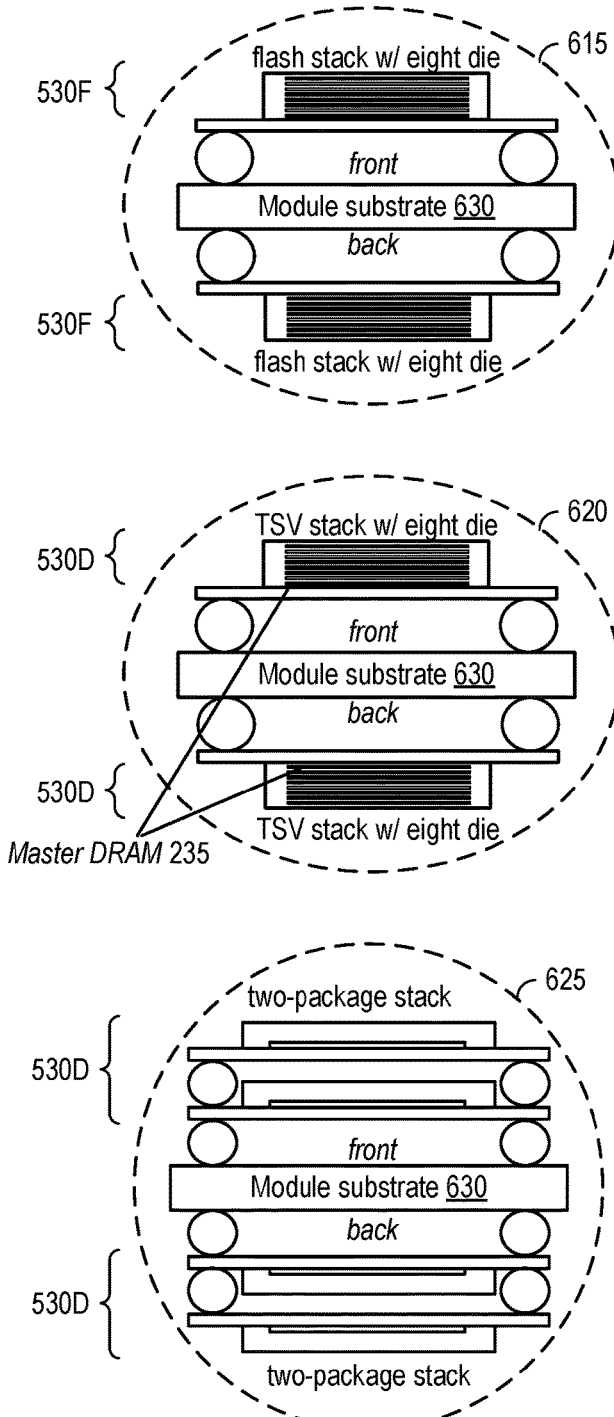

FIG. 6 depicts memory slice 525[4] of FIG. 5 in accordance with one embodiment. Each of DRAM components 530D includes a DRAM-component interface DQ[3:0] supporting a four-bit data width (the "volatile data width") connected to data-buffer component 535 via a respective one of the two secondary data link groups DQs[35:32] and DQs[39:36]. Each of flash components 530F includes a flash-component interface FQ connected to module controller 518(0) via multi-drop bus ADQf[15:0]. Component interfaces FQ and bus ADQf each support a sixteen-bit data width (the "nonvolatile data width"). Steering logic 600 and 605 allow DRAM components 530D to communicate data with controller 510, via primary data links DQp[39:32], or with flash components 530F via local bus DQt. Steering logic 605 and links DQt through DB component 535 additionally allow slice 525[4] to communicate data between module controller 518(0) and neighboring slices 525[3:0].

FIG. 6 additionally shows a packaging option 615 for flash components 530F and alternative packaging options 620 and 625 for DRAM components 530D. Flash packaging option 615 includes two stacks of eight flash devices, or "dies," interconnected by e.g. through-silicon vias (TSVs). Flash components 530F are on either side of module substrate 630 in this example. DRAM packaging option 620 includes two stacks of eight DRAM dies interconnected by e.g. TSVs. Module controller 518(0) thus selects a rank of DRAM dies, one from each DRAM component 530D, for each memory access. Each DRAM stack includes a master die 635 with data-buffer logic. In packaging option 625, DRAM components 530D are two-package stacks, one package on either side of module substrate 630. DRAM components 530D serve as cache storage for up to e.g. one sixteenth of the storage space afforded by flash components 530F. Other alternative arrangements with the same or different numbers of DRAM or nonvolatile memory dies or packages can also be used. Memory systems of the type detailed herein can have number of memory components and dies that are powers of two.

While the subject matter has been described in connection with specific embodiments, other embodiments are also envisioned. For example, some systems employ error-detection checksums and circuitry to report errors in lieu of more complex EDC support capable of error correction. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A controller to manage memory-access requests, the controller comprising:
   a nonvolatile memory (NVM) interface to a NVM with physical memory space divided into NVM cache lines; and
   a dynamic, random-access memory (DRAM) interface to a DRAM divided into DRAM cache lines;
   the controller to allocate an erased one of the NVM cache lines to one of the DRAM cache lines and write data, a dirty bit, and a state bit to the one of the DRAM cache lines, the state bit indicating the data is absent from the NVM.

2. The controller of claim 1, the controller to further write a valid bit to the one of the DRAM cache lines.

3. The controller of claim 2, the controller to further overwrite the data to second data and change the valid bit responsive to the second data in the one of the DRAM cache lines without changing the state bit.

4. The controller of claim 3, the controller further to:
   write the second data to one of the NVM cache lines; and
   evict the second data from the one of the DRAM cache lines.

5. The controller of claim 1, the controller further to write a physical address in the one of the DRAM cache lines with the state bit indicating the data is absent from the NVM.

6. The controller of claim 5, the controller further to write an NVM address of one of the NVM cache lines in the one of the DRAM cache lines with the state bit indicating the data is absent from the NVM.

7. The controller of claim 1, the controller further to store a cache tag with the data in the one of the DRAM cache lines, the cache tag mapping a physical address to the erased one of the NVM cache lines and the one of the DRAM cache lines.

8. The controller of claim 1, wherein each of the NVM cache lines stores a first number of bits and each DRAM cache line stores a second number of bits greater than the first number of bits, wherein the one of the DRAM cache lines stores a first tag mapping a physical address to the one of the DRAM cache lines and a second tag mapping the physical address to the erased one of the NVM cache lines.

9. The controller of claim 8, the controller to store the data and error-detection information in the one of the DRAM cache lines using the second number of bits and omits the error-detection information from the first number of bits.

10. A method for caching data, including first data and second data, the method comprising:
receiving a memory-allocation command;
allocating a DRAM cache line and a nonvolatile memory (NVM) cache line responsive to the memory-allocation command;
writing the first data and a state bit to the DRAM cache line, the state bit of a value indicating the first data is absent from the NVM cache line; and
writing the second data and the state bit to the DRAM cache line, the state bit of the value indicating the second data is absent from the NVM cache line.

11. The method of claim 10, further comprising evicting the second data from the DRAM cache line to a second NVM cache line.

12. The method of claim 11, further comprising:
reading the second data from the second NVM cache line and writing the second data to a second DRAM cache line.

13. The method of claim 12, further comprising writing the state bit with the second data in the DRAM cache, the state bit of a second value indicating the second data is in the NVM cache line.

14. The method of claim 13, further comprising writing a valid bit with the second data in the DRAM cache.

15. The method of claim 14, further comprising writing a dirty bit with the second data and the valid bit, the dirty bit of a value indicating the second data is in the DRAM cache.

16. A controller for caching data, including first data and second data, the controller comprising:
a nonvolatile memory (NVM) interface to a NVM with physical memory space divided into NVM cache lines;
a dynamic, random-access memory (DRAM) interface to a DRAM divided into DRAM cache lines; and
means for allocating an erased one of the NVM cache lines to one of the DRAM cache lines and writing data, a dirty bit, and a state bit to the one of the DRAM cache lines, the state bit indicating the data is absent from the NVM.

17. The controller of claim 16, the means additionally for allocating the one of the DRAM cache lines and one of the NVM cache lines responsive to a memory-allocation command.

18. The controller of claim 17, the means additionally for evicting the data from the one of the DRAM cache lines without having written the data to the one of the NVM cache lines.

19. The controller of claim 16, the means additionally to store a cache tag with the data in the one of the DRAM cache lines.

20. The controller of claim 16, wherein each of the NVM cache lines stores a first number of bits and each DRAM cache line stores a second number of bits greater than the first number of bits, wherein the one of the DRAM cache lines stores a first tag mapping a physical address to the one of the DRAM cache lines and a second tag mapping the physical address to the erased one of the NVM cache lines.

\* \* \* \* \*